United States Patent
Hara

(10) Patent No.: US 7,565,118 B2
(45) Date of Patent: Jul. 21, 2009

(54) POLAR MODULATION TRANSMISSION APPARATUS AND WIRELESS COMMUNICATION APPARATUS

(75) Inventor: Yoshihiro Hara, Osaka (JP)

(73) Assignee: Panasonic Corporation, Osaka (JP)

( * ) Notice: Subject to any disclaimer, the term of this patent is extended or adjusted under 35 U.S.C. 154(b) by 554 days.

(21) Appl. No.: 11/516,662

(22) Filed: Sep. 7, 2006

(65) Prior Publication Data

US 2007/0053463 A1    Mar. 8, 2007

(30) Foreign Application Priority Data

Sep. 8, 2005    (JP)    ............... 2005-260116

(51) Int. Cl.
*H04L 25/49* (2006.01)
(52) U.S. Cl. ...................... 455/108; 375/297
(58) Field of Classification Search .............. 455/23, 455/102, 114.3, 91, 126; 375/219, 295, 297, 375/300, 302
See application file for complete search history.

(56) References Cited

U.S. PATENT DOCUMENTS

| | | | |
|---|---|---|---|
| 6,844,788 B2* | 1/2005 | Chadwick | 332/159 |
| 7,109,816 B2* | 9/2006 | Khlat | 332/112 |
| 7,379,715 B2* | 5/2008 | Udagawa et al. | 455/126 |
| 2003/0206056 A1* | 11/2003 | Hietala | 330/100 |

FOREIGN PATENT DOCUMENTS

JP    2001-156554    6/2001
JP    3207153    7/2001

OTHER PUBLICATIONS

"AD6546 Othello-E Complete EDGE/GSM/GPRS Transceiver"—Analog Devices, Inc., doc. PH05816-3-11/05.*

* cited by examiner

*Primary Examiner*—Abul Azad
*Assistant Examiner*—Gennadiy Tsvey
(74) *Attorney, Agent, or Firm*—Wenderoth, Lind & Ponack, L.L.P.

(57) ABSTRACT

A polar modulation transmission apparatus for realizing a wide control range for transmission power, maintaining the modulation precision and the distortion characteristic at a superb level even at a low output, and providing a high power efficiency is provided. An adder 102 adds a logarithm-represented transmission power control signal S13 to a logarithm-represented amplitude signal S14, and outputs the resultant signal as a transmission power-controlled amplitude signal S5. A phase modulation section 104 outputs a high frequency phase-modulated signal S8 based on a phase signal S3. An amplitude signal amplifier 103 supplies a supply voltage to a high frequency power amplifier 106 based on an amplitude signal S5. The high frequency power amplifier 106 performs amplitude modulation on the high frequency phase-modulated signal S8 based on the supply voltage supplied thereto, and outputs the resultant signal as a high frequency transmission signal S10.

11 Claims, 13 Drawing Sheets

F I G. 4
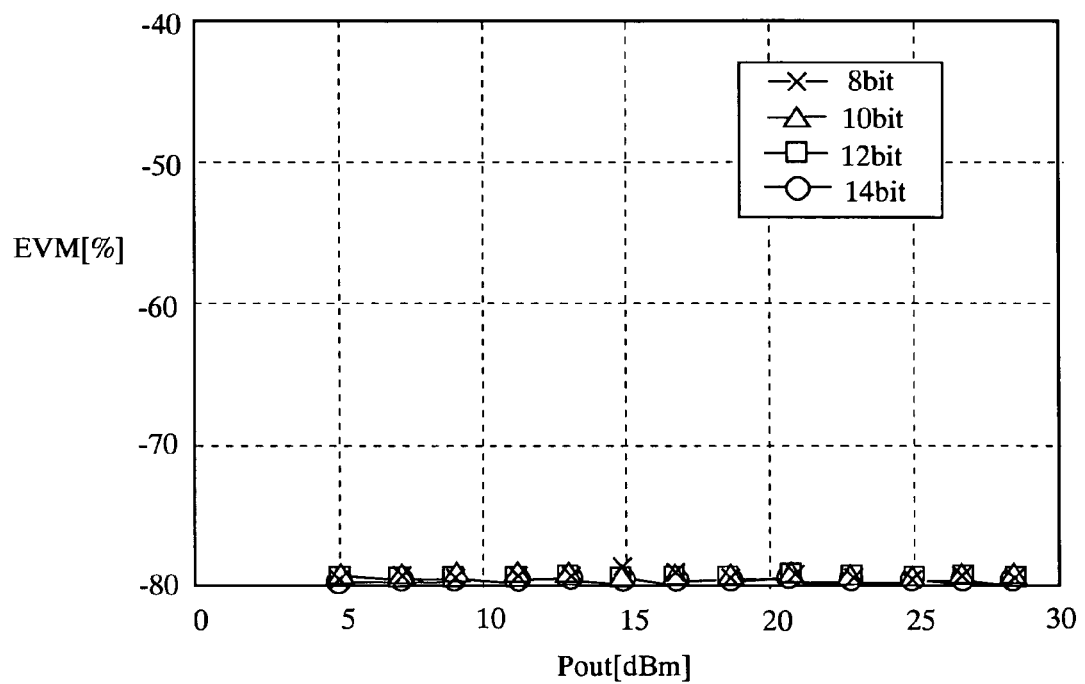

POLAR MODULATION TRANSMISSION APPARATUS AND WIRELESS COMMUNICATION APPARATUS

BACKGROUND OF THE INVENTION

1. Field of the Invention

The present invention relates to a polar modulation transmission apparatus and a wireless communication apparatus, and more specifically to a polar modulation transmission apparatus for maintaining a modulation precision and a distortion characteristic at a superb level even at a low output and realizing a superb power efficiency, even with a modulation system providing a wide dynamic range, and a wireless communication apparatus using the same.

2. Description of the Background Art

Conventionally, as a high frequency power amplifier for amplifying a modulation signal including an envelope varying component, a class A or class AB linear amplifier is used in order to amplify the envelope varying component linearly. Such a linear amplifier is superb in linearity, but constantly consumes power which accompanies a DC bias component and so has a lower power efficiency than, for example, a class C or class E nonlinear amplifier. When such a high frequency power amplifier is used in a mobile wireless communication apparatus having a battery as a power source, the battery life is short because the power consumption of the high frequency power amplifier is high. When such a high frequency power amplifier is used for a base station apparatus of a wireless system including a plurality of high power transmission apparatuses, the scale of the base station apparatus is enlarged and the amount of heat generation is increased.

In order to solve these problems, a transmission apparatus using a polar modulation system, which is operable at a high power efficiency, has been proposed. According to the polar modulation system, a baseband signal is separated into an amplitude signal and a phase signal, and then amplitude modulation and phase modulation are performed separately (see, for example, FIG. 10). In the example shown in FIG. 10, a high frequency phase-modulated signal processed by phase modulation based on a phase signal is multiplied by an amplitude signal using a multiplier to generate a high frequency transmission signal. A transmission apparatus using the polar modulation system allows a high frequency power amplifier acting as a multiplier to operate in a nonlinear mode (in a saturated mode) and therefore can improve the power efficiency. Technologies using this type of polar modulation system are disclosed in, for example, patent document 1 (Japanese Patent No. 3207153) and patent document 2 (Japanese Laid-Open Patent Publication No. 2001-156554).

FIG. 11 shows an example of functional blocks of a conventional transmission apparatus 500 using the polar modulation system. As shown in FIG. 11, the conventional transmission apparatus 500 includes an amplitude/phase separation section 501, a multiplier 502, an amplitude signal amplifier 503, a phase modulation section 504, a variable gain amplifier 505, a high frequency power amplifier 506, a digital/analog converter (hereinafter, referred to as a "D/A converter") 507, and a D/A converter 508.

The amplitude/phase separation section 501 separates an input baseband signal S51, which is to be modulated, into an amplitude signal S52 and a phase signal S53. The amplitude signal S52 and a transmission power control signal S54 for controlling the magnitude of transmission power are input to the multiplier 502. The multiplier 502 multiplies the amplitude signal S52 by the transmission power control signal S54, and outputs the resultant signal as a transmission power-controlled amplitude signal S55. The amplitude signal S55 is converted into an analog signal S56 by the D/A converter 507, and is supplied to the high frequency power amplifier 506 performing a nonlinear operation (saturated operation) via the amplitude signal amplifier 503 as a supply voltage S57.

On the other hand, the phase signal S53 is input to the phase modulation section 504. The phase modulation section 504 performs phase modulation on a carrier signal based on the phase signal S53, and outputs the resultant signal as a high frequency phase-modulated signal S58. The high frequency phase-modulated signal S58 is input to the variable gain amplifier 505. The gain of the variable gain amplifier 505 is controlled by an analog signal S62 obtained by D/A-converting a gain controlling digital signal S61 supplied from a control section (not shown). The variable gain amplifier 505 amplifies the high frequency phase-modulated signal S58 and outputs the resultant signal as a high frequency phase-modulated signal S59. The high frequency phase-modulated signal S59 is input to the high frequency power amplifier 506. The high frequency power amplifier 506 performs amplitude modulation on the high frequency phase-modulated signal S59 based on the supply voltage S57 supplied from the amplitude signal amplifier 503, and outputs the resultant signal as a high frequency transmission signal S60.

Next, an operation of the conventional transmission apparatus 500 will be described in detail using expressions. Where the baseband signal S1 to be modulated is Si(t), Si(t) is represented by expression (1) using complex numbers.

$$Si(t) = a(t) \cdot \exp[j\phi(t)] \qquad (1)$$

Here, a(t) represents amplitude data, and exp[jφ(t)] represents phase data. The amplitude/phase separation section 501 extracts amplitude data a(t) and phase data exp[jφ(t)] from the baseband signal Si(t). The amplitude data a(t) corresponds to the amplitude signal S52, and the phase data exp[jφt)] corresponds to the phase signal S53. The amplitude data a(t) is multiplied by power information G, represented by the transmission power control signal S54, by the multiplier 502, and is output as transmission power-controlled amplitude data G·a(t). The amplitude data G·a(t) is amplified by the amplitude signal multiplier 503, and is supplied to the high frequency power amplifier 506 as a supply voltage.

The phase modulation section 504 modulates a carrier wave at an angular frequency ωc based on phase data exp[jφ(t)] to generate the high frequency phase-modulated signal S58. Where the high frequency phase-modulated signal S58 is Sc, Sc is represented by expression (2).

$$Sc = \exp[j(\omega c t + \phi(t))] \qquad (2)$$

The high frequency power amplifier 506 multiplies the amplitude data G·a(t) by the high frequency phase-modulated signal S59 which is input via the variable gain amplifier 505, and outputs the resultant signal as the high frequency transmission signal S60. Where the high frequency transmission signal S60 is high frequency signal Srf, the high frequency signal Srf is represented by expression (3).

$$Srf = G \cdot a(t) \cdot \exp[j(\omega c t + \phi(t))] \qquad (3)$$

The conventional transmission apparatus 500 using the polar modulation system can improve the power efficiency because the amplitude (envelope) of the signal which is output from the high frequency power amplifier 506 is controlled by the supply voltage and thus the high frequency power amplifier 506 can perform a saturated operation.

However, the conventional transmission apparatus 500 has the following problems.

The dynamic range of the transmission power varies in accordance with the wireless communication system. In the case where the dynamic range is wider on the lower side, namely, in the case of a wireless communication system providing a small minimum value of the transmission power, the amplitude signal needs to have a very low level. Accordingly, the conventional transmission apparatus 500 requires a very low level signal as the transmission power-controlled amplitude signal S55.

FIG. 12 shows different varying ranges of the amplitude signal S55 in accordance with the magnitude of the transmission power. In FIG. 12, the horizontal axis represents the amplitude signal S55 in antilogarithm in units of volts (V). The varying ranges of the amplitude signal S55 in accordance with the magnitude of the transmission power are each represented as a continuous signal by a two-head arrow line segment. The scale of the horizontal axis schematically shows that when the amplitude signal S55 is represented as a digital signal, the values thereof are made discrete (quantized). It is understood that when the signal amplitude S55 provided in an antilogarithm representation is handled as a digital signal, the ratio of the quantization noise to the varying range of the amplitude signal S55 is increased as the transmission power is decreased. Namely, as the transmission power is decreased, the representation precision of the amplitude signal S55 is decreased due to the quantization noise. This deteriorates an ACLR (Adjacent Channel Leakage power Ratio) representing a distortion of a transmission signal or an EVM (Error Vector Magnitude) representing a modulation precision of a transmission signal.

The influence on the ACLR and the EVM exerted by the quantization noise when the amplitude signal S55 provided in an antilogarithm representation is handled as a digital signal was obtained by simulation. FIG. 13 shows a result of the simulation regarding the ACLR, and FIG. 14 shows a result of the simulation regarding the EVM. For the simulation, an EDGE (Enhanced Data GSM Environment)-modulated signal was used.

FIG. 13 shows the ACLR obtained as a result of detuning at 400 kHz (see part (a)) and at 600 kHz (see part (b)). FIG. 14 shows the RMS EVM by the standards of 3GPP (3rd Generation Partnership Project). The simulation was performed with four quantization bit rates of 14 bits, 12 bits, 10 bits and 8 bits. The high frequency power amplifier 506 at the final stage, where polar modulation is performed in order to check the influence of the quantization noise, was assumed to have an ideal linear characteristic (with no distortion).

As can be understood from FIG. 13 and FIG. 14, when the amplitude signal S55 provided in an antilogarithm representation is handled as a digital signal, as the transmission power decreases, the ACLR and the EVM are deteriorated. At the same transmission power, the ACLR and the EVM are deteriorated at a larger degree as the quantization bit rate becomes smaller.

In the above description regarding the deterioration in the ACLR and the EVM caused by the quantization noise, the amplitude signal S55 is handled as a digital signal. In the case where the amplitude signal S55 is handled as an analog signal also, the S/N ratio (signal-to-noise ratio) is deteriorated where the amplitude signal S55 is of a very low level. Qualitatively, the ACLR and the EVM are deteriorated in a similar manner to the case of the digital signal.

SUMMARY OF THE INVENTION

Therefore, an object of the present invention for solving the above-described problems is to provide a polar modulation transmission apparatus for maintaining a modulation precision and a distortion characteristic at a superb level even at a low output and realizing a superb power efficiency, even with a modulation system providing a wide dynamic range.

The present invention is directed to a polar modulation transmission apparatus. In order to attain the object mentioned above, the polar modulation transmission apparatus according to the present invention comprises an amplitude/phase separation section for separating a baseband signal to be modulated into an amplitude signal and a phase signal; a first antilogarithm/logarithm conversion section for performing antilogarithm/logarithm conversion on the amplitude signal and outputting the resultant signal as a logarithm-represented amplitude signal; a second antilogarithm/logarithm conversion section for performing antilogarithm/logarithm conversion on a transmission power control signal and outputting the resultant signal as a logarithm-represented transmission power control signal; an adder for adding the logarithm-represented transmission power control signal to the logarithm-represented amplitude signal, and outputting the resultant signal as a transmission power-controlled amplitude signal; a logarithm/antilogarithm conversion section for performing logarithm/antilogarithm conversion on the transmission power-controlled amplitude signal and outputting the resultant signal as an antilogarithm-represented amplitude signal; a phase modulation section for performing phase modulation on a high frequency carrier wave signal based on the phase signal and outputting the resultant signal as a high frequency phase-modulated signal; a high frequency power amplifier for performing amplitude modulation on the high frequency phase-modulated signal based on a supply voltage supplied thereto, and outputting the resultant signal as a high frequency transmission signal; and an amplitude signal amplifier for amplifying the antilogarithm-represented amplitude signal and supplying the resultant signal as the supply voltage to the high frequency power amplifier.

Owing to this, even when the transmission power is low and thus the amplitude signal is of a low level, the polar modulation transmission apparatus can restrict the deterioration in the representation precision of the amplitude signal caused by the deterioration in the quantization noise or the S/N ratio (signal-to-noise ratio), and thus can prevent the deterioration in the ACLR and the EVM. In addition, since the polar modulation transmission apparatus does not need to include a multiplier for multiplying the amplitude signal by a transmission power control signal, the circuit scale thereof can be significantly reduced.

Preferably, the high frequency power amplifier operates as a nonlinear amplifier and performs amplitude modulation on the high frequency phase-modulated signal in accordance with the transmission power control signal and the amplitude signal.

Preferably, the polar modulation transmission apparatus further comprises a variable gain amplifier for amplifying the high frequency phase-modulated signal with a controlled gain on a stage after the phase modulation section.

Preferably, the amplitude signal amplifier includes a switching regulator or a class D amplifier. Owing to this, the power efficiency of the amplitude signal amplifier can be improved. The power efficiency of the entire polar modulation transmission apparatus can also be improved.

The polar modulation transmission apparatus may further comprise a second adder for adjusting transmission power between the adder and the logarithm/antilogarithm conversion section. The second adder adds a gain controlling value to the transmission power controlled amplitude signal. Owing to this, the inter-individual variance of the output power can be easily adjusted during the production of the polar modulation transmission apparatus, and the gain of the amplitude signal can also be adjusted.

The amplitude signal amplifier may selectively supply the high frequency power amplifier with a supply voltage in accordance with the amplitude signal and the transmission power control signal or a predetermined fixed value supply voltage. When the supply voltage in accordance with the amplitude signal and the transmission power control signal is selected, the high frequency power amplifier operates as a nonlinear amplifier, and performs amplitude modulation on the high frequency phase-modulated signal amplified by the variable gain amplifier in accordance with the transmission power control signal and the amplitude signal and outputs the resultant signal as the high frequency transmission signal. By contrast, when the predetermined fixed value supply voltage is selected, the variable gain amplifier performs amplitude modulation on the high frequency phase-modulated signal which is output from the phase modulation section in accordance with the transmission power control signal and the amplitude signal, and the high frequency power amplifier operates as a linear amplifier, and amplifies the signal processed by the amplitude modulation by the variable gain amplifier and outputs the resultant signal as the high frequency transmission signal.

Owing to this, the polar modulation transmission apparatus can select whether to perform the amplitude modulation using the high frequency power amplifier or to perform the amplitude modulation using the variable gain amplifier, in accordance with the magnitude of the transmission power. Thus, the polar modulation transmission apparatus can keep the distortion characteristic and the modulation precision of the transmission signal at a superb level regardless of the control range for the transmission power.

Preferably, the polar modulation transmission apparatus further comprises a third adder for adjusting transmission power between the adder and the variable gain amplifier. The third adder adds a gain adjusting value to the transmission power-controlled amplitude signal. Owing to this, the difference in the gain to the amplitude signal caused by whether the amplitude modulation is performed by the high frequency power amplifier or by the variable gain amplifier can be adjusted. The inter-individual variance of the variable gain amplifier is also adjusted during the production thereof.

Preferably, the polar modulation transmission apparatus further comprises a D/A conversion section at any position on a stage before the logarithm/antilogarithm conversion section. An analog signal converted by the D/A conversion section is input to the logarithm/antilogarithm conversion section. Owing to this, the logarithm/antilogarithm conversion section can realize logarithm/antilogarithm conversion relatively easily by using an analog input/output exponential function characteristic of a bipolar transistor. The influence of the quantization noise, which is conspicuous when a low level signal is used in a digital circuit, can be suppressed. Thus, the effect obtained by representing the amplitude signal in a logarithm representation can be made more conspicuous.

The polar modulation transmission apparatus may further comprise a predistortion section, connected at any location at a stage before the high frequency power amplifier, for predistorting the amplitude signal supplied as a supply voltage to the high frequency power amplifier, such that at least a distortion generated in the high frequency power amplifier is suppressed. Owing to this, the polar modulation transmission apparatus can realize an operation with less distortion.

The present invention is also directed to a wireless communication section. The wireless communication section comprises a transmission circuit for generating a transmission signal; and an antenna for outputting the transmission signal generated by the transmission circuit. As the transmission circuit, the above-described polar modulation transmission apparatus is used. The wireless communication apparatus may further comprise a receiving circuit for processing a receiving signal received from the antenna; and an antenna duplexer section for outputting the transmission signal generated by the transmission circuit to the antenna, and outputting the receiving signal received from the antenna to the receiving circuit.

Owing to this, the wireless communication apparatus can widen the control range in which the transmission circuit can control the transmission power, and can maintain the modulation precision and the distortion characteristic at a superb level even at a low output. Therefore, a high ACLR or EVM characteristic can be realized over a wide range of transmission power. Since the power efficiency is high, the life of the battery mounted on the wireless communication apparatus can be extended.

As described above, in a polar modulation transmission apparatus according to the present invention, the antilogarithm/logarithm conversion section performs antilogarithm/logarithm conversion on an amplitude signal and a transmission power control signal, and output the resultant signals as a logarithm-represented amplitude signal and a logarithm-represented transmission power control signal. In this way, the polar modulation transmission apparatus can perform transmission power control on the amplitude signal merely by adding the logarithm-represented amplitude signal and the logarithm-represented transmission power control signal by the adder. The transmission apparatus, which does not need to include a multiplier for multiplying an amplitude signal by a transmission power control signal, can significantly reduce the circuit scale thereof.

The polar modulation transmission apparatus handles a logarithm-represented amplitude signal. Therefore, the ratio of the quantization noise to the varying range of the amplitude signal is kept the same regardless of the magnitude of the transmission power. For this reason, even when the transmission power is low and thus the amplitude signal is of a low level, the polar modulation transmission apparatus can restrict the deterioration in the representation precision of the amplitude signal caused by the deterioration in the quantization noise or the S/N ratio (signal-to-noise ratio), and thus can prevent the deterioration in the ACLR and the EVM. Thus, the polar modulation transmission apparatus can maintain a modulation precision and a distortion characteristic at a superb level even at a low output and realize a superb power efficiency, even with a modulation system providing a wide dynamic range.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 shows a result of simulation indicating the influence of the quantization noise on the EVM according to the present invention;

DESCRIPTION OF THE PREFERRED EMBODIMENTS

Hereinafter, the present invention will be described in detail by way of embodiments with reference to the drawings.

First Embodiment

Figure 1:
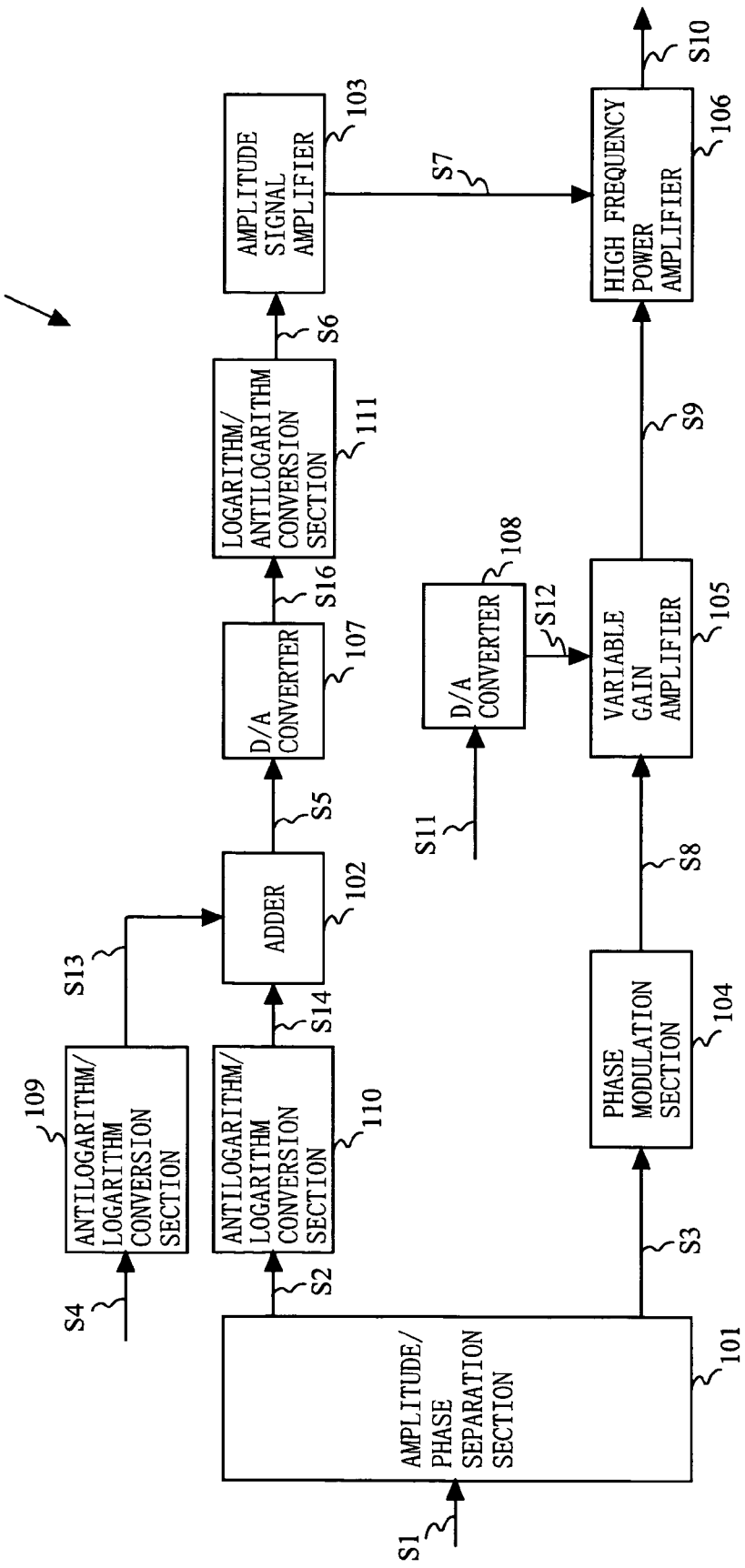
FIG. 1 is a block diagram showing an exemplary schematic structure of a polar modulation transmission apparatus according to a first embodiment of the present invention.

FIG. 1 is a block diagram showing an exemplary schematic structure of a polar modulation transmission apparatus 100 according to a first embodiment of the present invention. As shown in FIG. 1, the polar modulation transmission apparatus (hereinafter, referred to simply as the "transmission apparatus") 100 includes an amplitude/phase separation section 101, an adder 102, an amplitude signal amplifier 103, a phase modulation section 104, a variable gain amplifier 105, a high frequency power amplifier 106, a D/A converter 107, a D/A converter 108, an antilogarithm/logarithm conversion section 109, an antilogarithm/logarithm conversion section 110, and a logarithm/antilogarithm conversion section 111.

The transmission apparatus 100 modulates a baseband signal S1, which to be modulated, using the polar modulation system, and outputs the resultant signal as a high frequency transmission signal S10. Hereinafter, an operation of the transmission apparatus 100 will be described in detail. The baseband signal S1 is input to the amplitude/phase separation section 101 as a digital signal. The amplitude/phase separation section 101 separates the input baseband signal S1 into an amplitude signal S2 and a phase signal S3.

The amplitude signal S2 is input to the antilogarithm/logarithm conversion section 110. The antilogarithm/logarithm conversion section 110 performs antilogarithm/logarithm conversion on the input amplitude signal S2, and outputs the resultant signal as a logarithm-represented amplitude signal S14. A transmission power control signal S4 for controlling the magnitude of transmission power is input to the antilogarithm/logarithm conversion section 109. The antilogarithm/logarithm conversion section 109 performs antilogarithm/logarithm conversion on the transmission power control signal S4, and outputs the resultant signals as a logarithm-represented transmission power control signal S13. The antilogarithm/logarithm conversion sections 109 and 110 may perform antilogarithm/logarithm conversion by a digital circuit for performing logical operations, or using a ROM table or the like which defines the relationship between input signals and output signals (antilogarithm and logarithm).

The transmission power control signal S13 and the amplitude signal S14 are input to the adder 102. The adder 102 adds the transmission power control signal S13 to the amplitude signal S14, and outputs the resultant signal as a transmission power-controlled amplitude signal S5. The amplitude signal S5 is converted into an analog signal S16 by the D/A converter 107. The transmission apparatus 100 may include a low pass filter (not shown) after the D/A converter 107.

The analog signal S16 is processed by logarithm/antilogarithm conversion by the logarithm/antilogarithm conversion section 111, and is output as an antilogarithm-represented amplitude signal S6. The amplitude signal S6 has a current driving capability thereof amplified by the amplitude signal amplifier 103, and is supplied to the high frequency power amplifier 106 as a supply voltage S7. The amplitude signal amplifier 103 preferably includes a switching regulator or a class D amplifier in order to increase the power efficiency.

On the other hand, the phase signal S3 is input to the phase modulation section 104. The phase modulation section 104 performs phase modulation on a carrier wave signal based on the phase signal S3, and outputs the resultant signal as a high frequency phase-modulated signal S8. The high frequency phase-modulated signal S8 is input to the variable gain amplifier 105. The gain of the variable gain amplifier 105 is controlled by an analog signal S12 obtained by D/A-converting a digital signal S11 supplied from a control section (not shown). The variable gain amplifier 105 amplifies the high frequency phase-modulated signal S8 and outputs the resultant signal as a high frequency phase-modulated signal S9.

The high frequency phase-modulated signal S9 is input to the high frequency power amplifier 106. The high frequency power amplifier 106 performs amplitude modulation on the high frequency phase-modulated signal S9 based on the amplitude signal S7 supplied as the supply voltage from the amplitude signal amplifier 103, and outputs the resultant signal the high frequency transmission signal S10.

The transmission apparatus 100 handles the logarithm-represented amplitude signal S14 and the logarithm-represented transmission power control signal S13. Therefore, the transmission apparatus 100 can perform calculations relating to transmission power control, which would otherwise requires a multiplier, by the adder 102. For this reason, the transmission apparatus 100 does not need to include a multiplier and thus can significantly reduce the circuit scale thereof.

Figure 2:
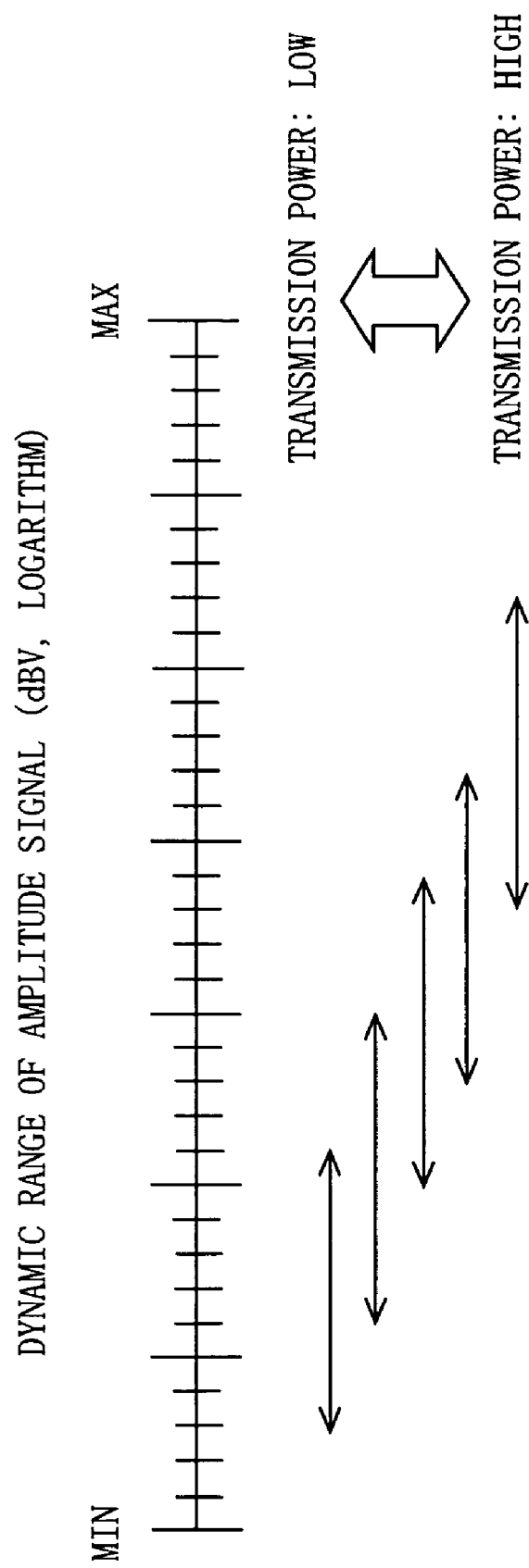
FIG. 2 shows different varying ranges of an amplitude signal S5 in accordance with the magnitude of transmission power.

The transmission power-controlled amplitude signal S5 is provided in a logarithm representation. Therefore, even if having a very small value in an antilogarithm representation, the amplitude signal S5 can be represented in the same varying range as in the case of having a large value. FIG. 2 shows different varying ranges of the amplitude signal S5 in accordance with the magnitude of the transmission power. In FIG. 2, the horizontal axis represents the amplitude signal S5 in logarithm in units of dBV. The varying ranges of the amplitude signal S5 in accordance with the magnitude of the transmission power are each represented as a continuous signal by a two-head arrow line segment. The scale of the horizontal axis schematically shows that when the amplitude signal S5 is represented as a digital signal, the values thereof are made discrete (quantized).

It is understood from FIG. 2 that when the logarithm-represented signal amplitude S5 is handled as a digital signal, the varying range of the amplitude signal S5 is kept the same regardless of the magnitude of the transmission power. It is also understood that the ratio of the quantization noise to the varying range of the amplitude signal S5 is kept the same regardless of the magnitude of the transmission power. Namely, even when the transmission power is low, the representation precision of the amplitude signal S5 does not decline due to the quantization noise. The deterioration in the ACLR representing a distortion of a transmission signal or the EVM representing a modulation precision can be prevented.

Figure 3:
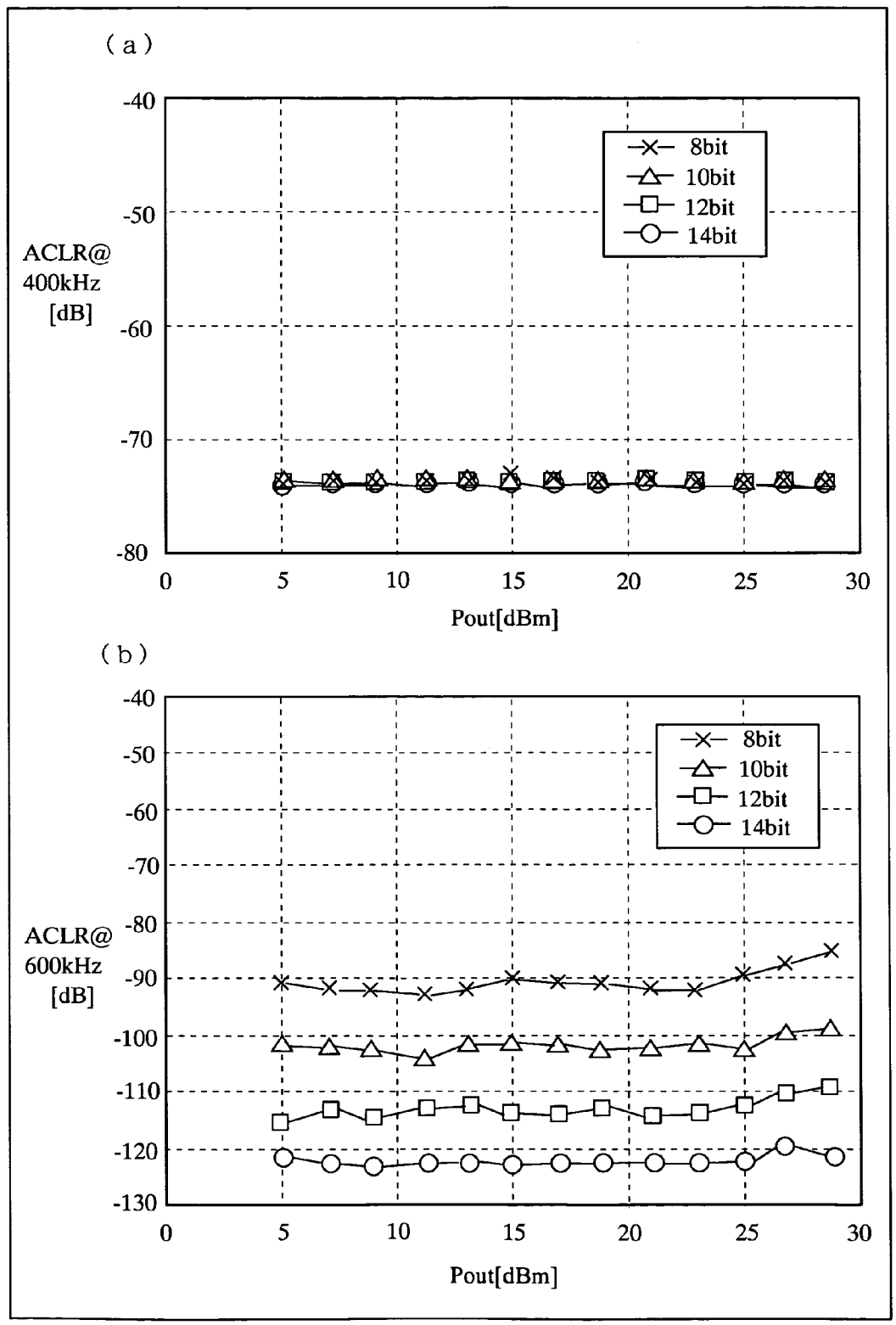
FIG. 3 shows a result of simulation indicating the influence of the quantization noise on the ACLR according to the present invention.

The influence on the ACLR and the EVM exerted by the quantization noise when the logarithm-represented amplitude signal S5 is handled as a digital signal was obtained by simulation. FIG. 3 shows a result of the simulation regarding the ACLR, and FIG. 4 shows a result of the simulation regarding the EVM. For the simulation, an EDGE-modulated signal was used.

FIG. 3 shows the ACLR obtained as a result of detuning at 400 kHz (see part (a)) and at 600 kHz (see part (b)). FIG. 4 shows the RMS EVM by the standards of 3GPP. The simulation was performed with four quantization bit rates of 14 bits, 12 bits, 10 bits and 8 bits. The high frequency power amplifier 106 at the final stage, where polar modulation is performed in order to check the influence of the quantization noise, was assumed to have an ideal linear characteristic (with no distortion).

As can be understood from FIG. 3 and FIG. 4, when the logarithm-represented amplitude signal S5 is handled as a digital signal, neither the ACLR nor EVM is deteriorated even when the transmission power is decreased. The ACLR curves in FIG. 3 (part (b)) obtained as a result of detuning at 600 kHz indicate that the distortion is decreased as the quantization bit rate is increased. This is because the minimum value of distortion is restricted by the quantization noise.

In the above description regarding the deterioration in the ACLR and EVM caused by the quantization noise, the amplitude signal S5 is handled as a digital signal. In the case where the amplitude signal S5 is handled as an analog signal also, the S/N ratio (signal to noise ratio) is deteriorated where the amplitude signal S5 is of a very low level. Qualitatively, the ACLR and EVM are deteriorated in a similar manner to the case of the digital signal. The present invention provides substantially the same effects whether the amplitude signal S5 is handled as a digital signal or an analog signal. When the amplitude signal S5 is handled as an analog signal, the transmission apparatus 100 does not need to include the D/A converter 107.

In the above embodiment, the functional blocks on a stage before the logarithm/antilogarithm conversion section 111 (e.g., the amplitude/phase separation section 101, the antilogarithm/logarithm conversion sections 109 and 110, and the adder 102) are assumed to be constructed of a digital circuit. Alternatively, these blocks may be constructed of an analog circuit. Accordingly, the D/A converter 107 may be connected at any location instead of the location shown in FIG. 1.

It is preferred, however, that an analog signal is input to the logarithm/antilogarithm conversion section 111, for the following reason. The logarithm/antilogarithm conversion section 111 can perform logarithm/antilogarithm conversion relatively easily by using an analog input/output exponential function characteristic of a bipolar transistor. Therefore, it is preferable that the logarithm/antilogarithm conversion section 111 is constructed of an analog circuit and that an analog signal obtained by D/A conversion is input to the logarithm/antilogarithm conversion section 111.

In the transmission apparatus 100, the transmission power control signal S4 and the amplitude signal S2 are processed by antilogarithm/logarithm conversion by the antilogarithm/logarithm conversion sections 109 and 110. Alternatively, a logarithm-represented amplitude signal or a logarithm-represented transmission power control signal may be directly input to the adder 102 from the amplitude/phase separation section 101 or the control section (not shown). In this case, the transmission apparatus 100 does not need to include the antilogarithm/logarithm conversion section 109 or 110, and thus can reduce the circuit scale thereof. The variable gain amplifier 105 and the D/A converter 108 may be omitted in the case where the high frequency phase-modulated signal S8 is of an appropriate level.

As described above, in the transmission apparatus 100 according to the first embodiment of the present invention, the antilogarithm/logarithm conversion sections 110 and 109 perform antilogarithm/logarithm conversion on the amplitude signal S2 and the transmission power control signal S4, and output the resultant signals as the logarithm-represented amplitude signal S14 and the logarithm-represented transmission power control signal S13. In this way, the transmission apparatus 100 can perform transmission power control on the amplitude signal merely by adding the logarithm-represented amplitude signal S14 and the logarithm-represented transmission power control signal S13 by the adder 102. The transmission apparatus 100, which does not need to include a multiplier for multiplying an amplitude signal by a transmission power control signal, can significantly reduce the circuit scale thereof.

The transmission apparatus 100 handles a logarithm-represented amplitude signal. Therefore, the ratio of the quantization noise to the varying range of the amplitude signal is kept the same regardless of the magnitude of the transmission power. For this reason, even when the transmission power is low and thus the amplitude signal is of a low level, the transmission apparatus 100 can restrict the deterioration in the representation precision of the amplitude signal caused by the deterioration in the quantization noise or the S/N ratio (signal-to-noise ratio), and thus can prevent the deterioration in the ACLR and the EVM.

Second Embodiment

Figure 5:
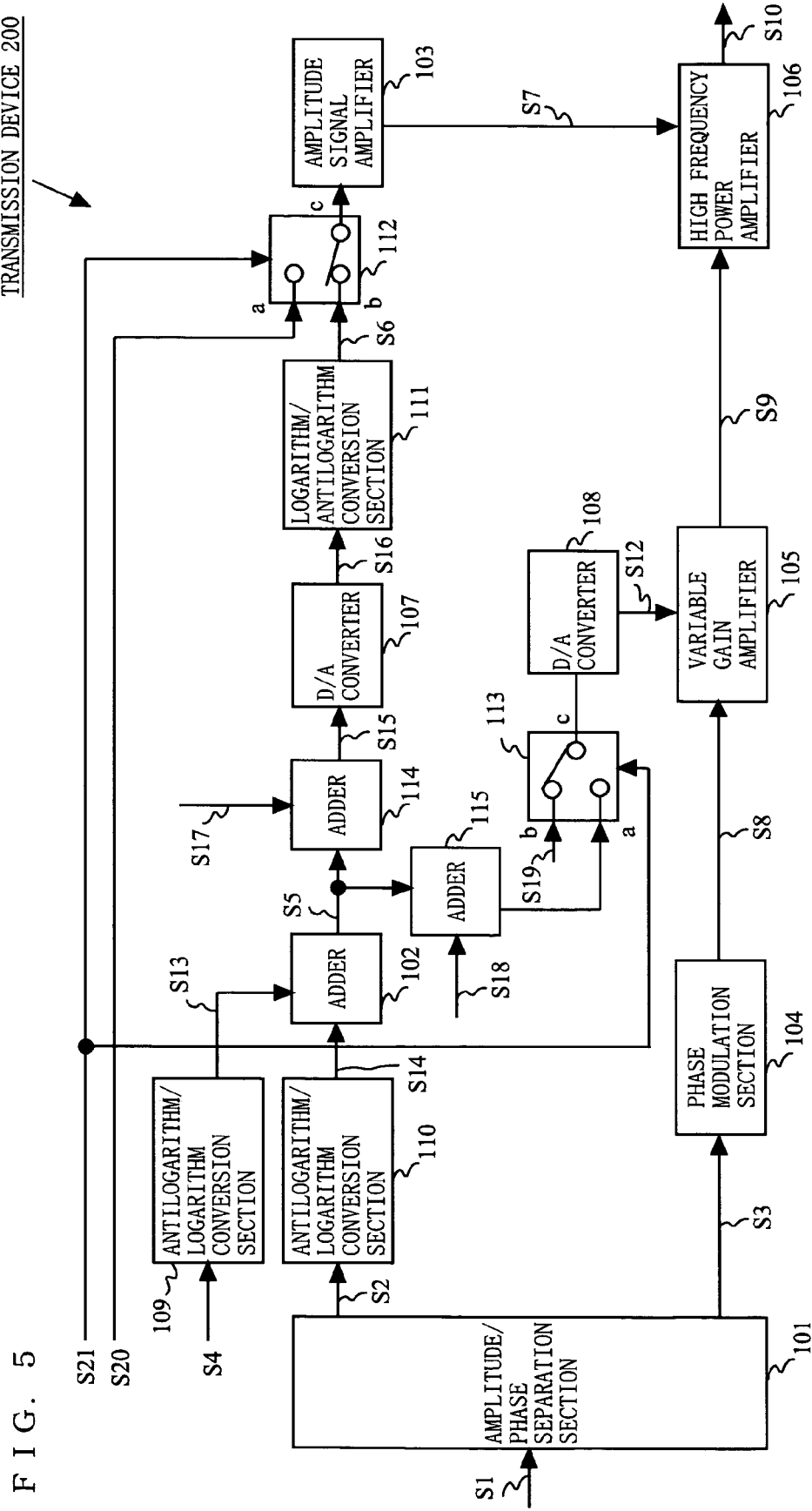
FIG. 5 is a block diagram showing an exemplary schematic structure of a polar modulation transmission apparatus according to a second embodiment of the present invention.

FIG. 5 is a block diagram showing an exemplary schematic structure of a polar modulation transmission apparatus 200 according to a second embodiment of the present invention. As shown in FIG. 5, the polar modulation transmission apparatus (hereinafter, referred to simply as the "transmission apparatus") 200 includes an adder 114, an adder 115, a switch 112, and a switch 113, in addition to the elements included in the transmission apparatus 100 according to the first embodiment.

The transmission apparatus 200 modulates a baseband signal S1, which is to be modulated, using the polar modulation system, and outputs the resultant signal as a high frequency transmission signal S10. Hereinafter, an operation of the transmission apparatus 200 will be described in detail. Identical blocks and signals to those in the first embodiment bear the identical reference numerals thereto and the descriptions thereof will be omitted.

Unlike the transmission apparatus 100 according to the first embodiment, the transmission apparatus 200 performs amplitude modulation by the high frequency power amplifier 106 when the transmission power is high and performs amplitude modulation by the variable gain amplifier 105 when the transmission power is low.

When the transmission power is high, it is preferable to operate the high frequency power amplifier 106 as a nonlinear amplifier (in a nonlinear mode) from the viewpoint of power efficiency. By contrast, when the transmission power is low and is outside the range in which the high frequency power amplifier 106 is operable as a nonlinear amplifier, it is preferable to operate the high frequency power amplifier 106 as a linear amplifier (in a linear mode).

In which mode the high frequency power amplifier 106 is to be operated is determined by a control section (not shown) based on, for example, a transmission power control signal from a wireless base station or the transmission power based on the state of the received signal.

Referring to FIG. 5, the switches 112 and 113 switch the terminal connection to a connection of terminals a-c or a connection of terminals b-c by a switching signal S21, which is output from the control section (not shown) in accordance with the magnitude of the transmission power. By such switching performed by the switches 112 and 113, the transmission apparatus 200 causes the high frequency power amplifier 106 to perform amplitude modulation when the transmission power is high, and causes the variable gain amplifier 105 to perform amplitude modulation when the transmission power is low. The adders 114 and 115 respectively add a predetermined value given by signals S17 and S18 to the amplitude signal S5 which is output from the adder 102.

The roles of the adders 114 and 115 will be described in detail. In general, the gain given to the amplitude signal S5 is different between when the amplitude modulation is performed by the high frequency power amplifier 106 and when the amplitude modulation is performed by the variable gain amplifier 105. The adders 114 and 115 add a predetermined value (constant value) to the amplitude signal S5 as required, to adjust the gain to the amplitude signal S5. The adders 114 and 115 may be used for the purpose of adjusting the variance of the output power which is caused by the inter-individual variance of the high frequency power amplifier 106 and the variable gain amplifier 105.

When the transmission power is high and the high frequency power amplifier 106 performs the amplitude modulation, the switches 112 and 113 each connect the terminals b and c. The gain of the variable gain amplifier 105 is controlled by the analog signal S12 obtained by D/A-converting a digital signal S19 from the control section (not shown). The variable gain amplifier 105 amplifiers the high frequency phase-modulated signal S8 and outputs the resultant signal as the high frequency phase-modulated signal S9. The high frequency power amplifier 106 performs amplitude modulation on the high frequency phase-modulated signal S9 based on the amplitude signal S7 supplied as the supply voltage from the amplitude signal amplifier 103, and outputs the resultant signal as the high frequency transmission signal S10.

When the transmission power is low and the phase amplifier 105 performs the amplitude modulation, the switches 112 and 113 each connect the terminals a and c. As a result, the analog signal S12 obtained by D/A-converting the amplitude signal S5 is input to the variable gain amplifier 105 via the switch 113. The variable gain amplifier 105 performs amplitude modulation on the high frequency phase-modulated signal S8 based on the input analog signal S12. Namely, the variable gain amplifier 105 performs amplitude modulation on the high frequency phase-modulated signal S8 in accordance with the transmission power control signal S4 and the amplitude signal S2.

A fixed voltage value signal S20 representing a fixed voltage value is input to the amplitude signal amplifier 103 via the switch 112 from the control section (not shown). The fixed voltage value signal S20 is amplified by the amplitude signal amplifier 103 and is supplied as a supply voltage to the high frequency power amplifier 106. Accordingly, the high frequency power amplifier 106 operates as a linear amplifier, and amplifies the high frequency phase-modulated signal S9, processed by the amplitude modulation by the variable gain amplifier 105, with a constant gain and outputs the resultant signal as the high frequency transmission signal S10.

Figure 6:
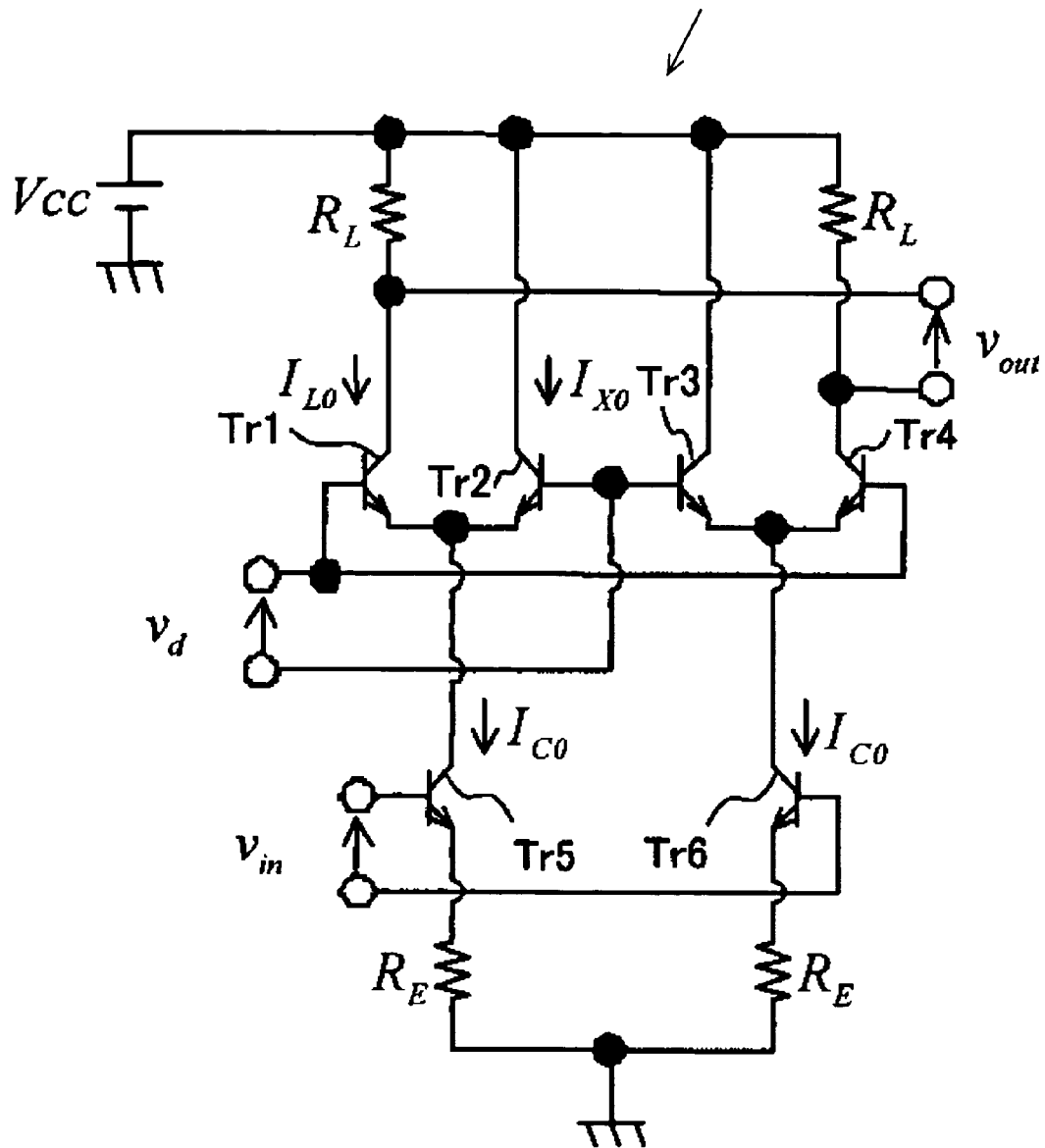
FIG. 6 shows an exemplary circuit configuration of a gain variable amplifier.

Hereinafter, a characteristic of a general gain variable amplifier will be described. With a general gain variable amplifier, a voltage gain $V_{out}/V_{in}$ between the input and the output is an exponential function of a gain control signal. FIG. 6 shows an exemplary circuit configuration of such a gain variable amplifier.

In FIG. 6, $V_{in}$ is a differential input signal, $V_{out}$ is a differential output signal, $V_d$ is a (differential) gain control signal, and $V_{cc}$ is a supply voltage. $R_E$ is an emitter resistor, and $R_L$ is a load resistor. Transistors Tr5 and Tr6 connected to an input terminal, to which the differential input signal $V_{in}$ is input, are emitter-grounded, and thus a differential current $G_m \cdot V_{in}$ flows through the collector. $G_m$ is represented by expression (4).

$$G_m = \frac{1}{\frac{V_T}{I_{C0}} + R_E} \quad (4)$$

At room temperature, $V_T$ has a value of about 26 mV.

By transistors Tr1, Tr2, Tr3 and Tr4 connected to an input terminal, to which the gain control signal $V_d$ is input, the differential current is divided in accordance with $V_d$, and a voltage drop occurs by the load resistor $R_L$. As a result, the relationship of the voltage gains $V_{out}/V_{in}$ between the input and output is represented by expression (5).

$$\frac{v_{out}}{v_{in}} = \frac{R_L}{\frac{V_T}{I_{C0}} + R_E} \cdot \frac{1}{1 + \exp\left(-\frac{v_d}{V_T}\right)} \quad (5)$$

Expression (5) is approximated to expression (6) when $V_d/V_T \ll -1$ (when the input is sufficiently low).

$$\frac{v_{out}}{v_{in}} \cong \frac{R_L}{\frac{V_T}{I_{C0}} + R_E} \cdot \exp\left(\frac{v_d}{V_T}\right) \quad (6)$$

It is understood from the above that the voltage gain $V_{out}/V_{in}$ between the input and the output is an exponential function of the gain control signal $V_d$.

The variable gain amplifier 105 shown in FIG. 5 has such an exponential function characteristic, and therefore has a logarithm/antilogarithm conversion function. For this reason, the transmission apparatus 200 (FIG. 5) does not need to include any logarithm/antilogarithm conversion section on a stage before the variable gain amplifier 105, and thus can significantly reduce the circuit scale thereof.

Figure 7:
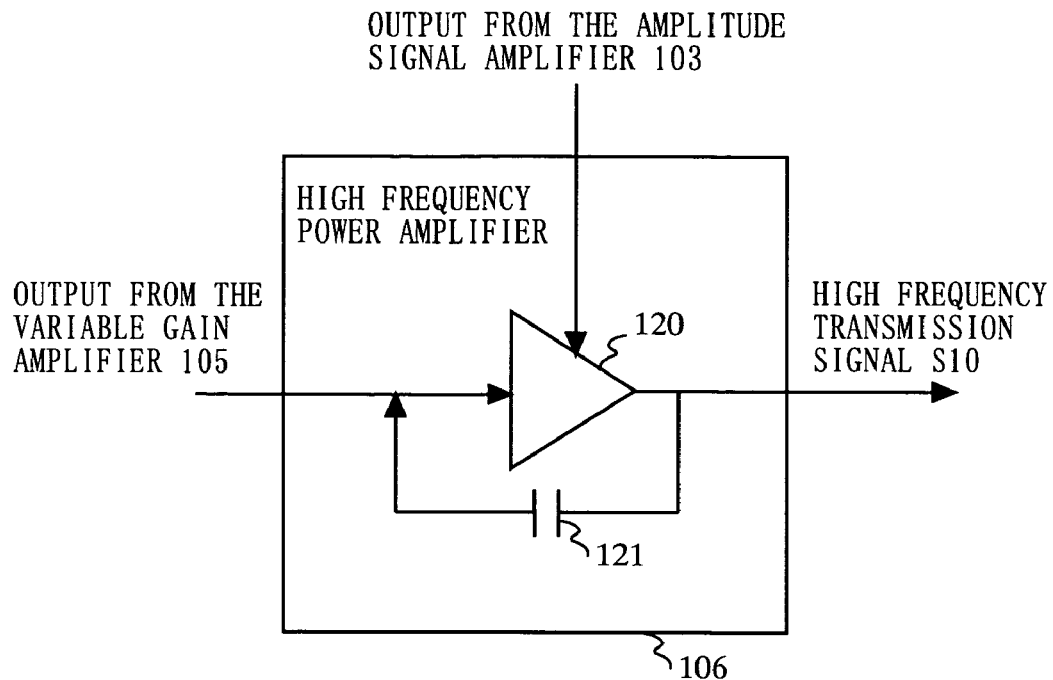
FIG. 7 shows an exemplary circuit configuration of a high frequency power amplifier 106.

Next, in which case the transmission power goes out of the range in which the high frequency power amplifier 106 is operable as a nonlinear amplifier will be described. FIG. 7 shows an exemplary circuit configuration of the high frequency power amplifier 106. The high frequency power amplifier 106 may include a nonlinear amplifier 120 and a parasitic capacitor 121 connected between an input and an output of the nonlinear amplifier 120.

Figure 8:
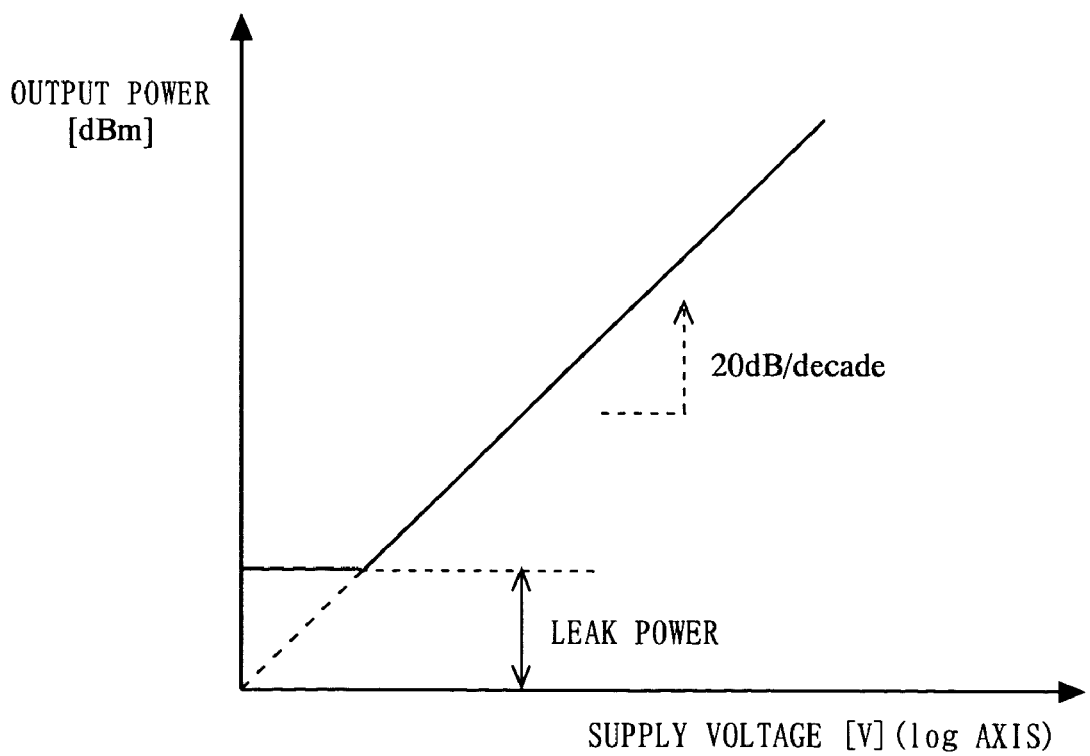
FIG. 8 shows the relationship between the supply voltage and the output power of the high frequency power amplifier 106 in the case where the high frequency power amplifier 106 is used as a nonlinear amplifier.

FIG. 8 shows the relationship between the supply voltage and the output power of the high frequency power amplifier 106 in the case where the high frequency power amplifier 106 is used as a nonlinear amplifier. As shown in FIG. 8, where the output power is high, the output power is in proportion to the square of the supply voltage. However, the output power is not decreased to be lower than a certain value as the supply voltage decreases. This certain value is determined by the level of a signal which is input to the nonlinear amplifier 120 (the level of the signal which is output from the variable gain amplifier 105) and the leak power from the input signal defined by the value of the parasitic capacitor 121. As described above, where the supply voltage of the high frequency power amplifier 106 is very low, it is difficult to perform highly linear amplitude modulation based on the supply voltage, due to the leak power from the signal which is input to the high frequency power amplifier 106.

For this reason, when the transmission power is sufficiently low, the transmission apparatus 200 performs highly linear amplitude modulation using the variable gain amplifier 105 on a stage before the high frequency power amplifier 106 and uses the high frequency power amplifier 106 as a linear amplifier.

As described above, the transmission apparatus 200 according to the second embodiment of the present invention performs amplitude modulation using the high frequency power amplifier 106 as a nonlinear amplifier when the transmission power is high, and performs amplitude modulation using the variable gain amplifier 105 and uses the high frequency power amplifier 106 as a linear amplifier when the transmission power is low. Thus, the transmission apparatus 200 can maintain the distortion characteristic and the modulation precision of the transmission signal at a superb level regardless of the control range for the transmission power.

Like the first embodiment, in the transmission apparatus 200, the antilogarithm/logarithm conversion sections 110 and 109 perform antilogarithm/logarithm conversion on the amplitude signal S2 and the transmission power control signal S4, and output the resultant signals as the logarithm-represented amplitude signal S14 and the logarithm-represented transmission power control signal S13. Therefore, the second embodiment provides the same effects as those of the first embodiment.

In the transmission apparatus 200, the amplitude signal S2 and the transmission power control signal S4 are processed by antilogarithm/logarithm conversion by the antilogarithm/logarithm conversion sections 110 and 109. Alternatively, a logarithm-represented amplitude signal or a logarithm-represented transmission power control signal may be directly input to the adder 102 from the amplitude/phase separation section 101 or the control section (not shown). In this case, the transmission apparatus 200 can reduce the circuit scale thereof.

Even when the high frequency power amplifier 106 is to perform amplitude modulation, the variable gain amplifier 105 on a stage before the high frequency power amplifier 106 can also perform amplitude modulation. In this case, the input power to the high frequency power amplifier 106 varies in accordance with the instant power of the amplitude signal S2. Thus, when the transmission power of the high frequency power amplifier 106 is to be decreased, the input power to the high frequency power amplifier 106 can be decreased and the leak power of the high frequency power amplifier 106 is decreased. Therefore, the range in which the high frequency power amplifier 106 is operable in a linear mode can be widened.

The variable gain amplifier 105 does not need to use the above-described input-output relationship as an exponential function. When the input-output relationship is linear, the transmission apparatus 200 can include a logarithm/antilogarithm conversion section on a stage before the variable gain amplifier 105.

The transmission apparatuses 100 and 200 may select whether or not to perform antilogarithm/logarithm conversion on the amplitude signal S2 and the transmission power control signal S4 in accordance with the range of the transmission power. For example, the transmission apparatuses 100 and 200 may perform antilogarithm/logarithm conversion on the amplitude signal S2 and the transmission power control signal S4 only when the transmission power is lower than a predetermined value.

The simulation results shown in FIG. 3 and FIG. 4 are obtained using an EDGE-modulated signal. Substantially the same results are obtained with modulation systems other than the EDGE modulation system by providing an amplitude signal in a logarithm representation.

Figure 9A:
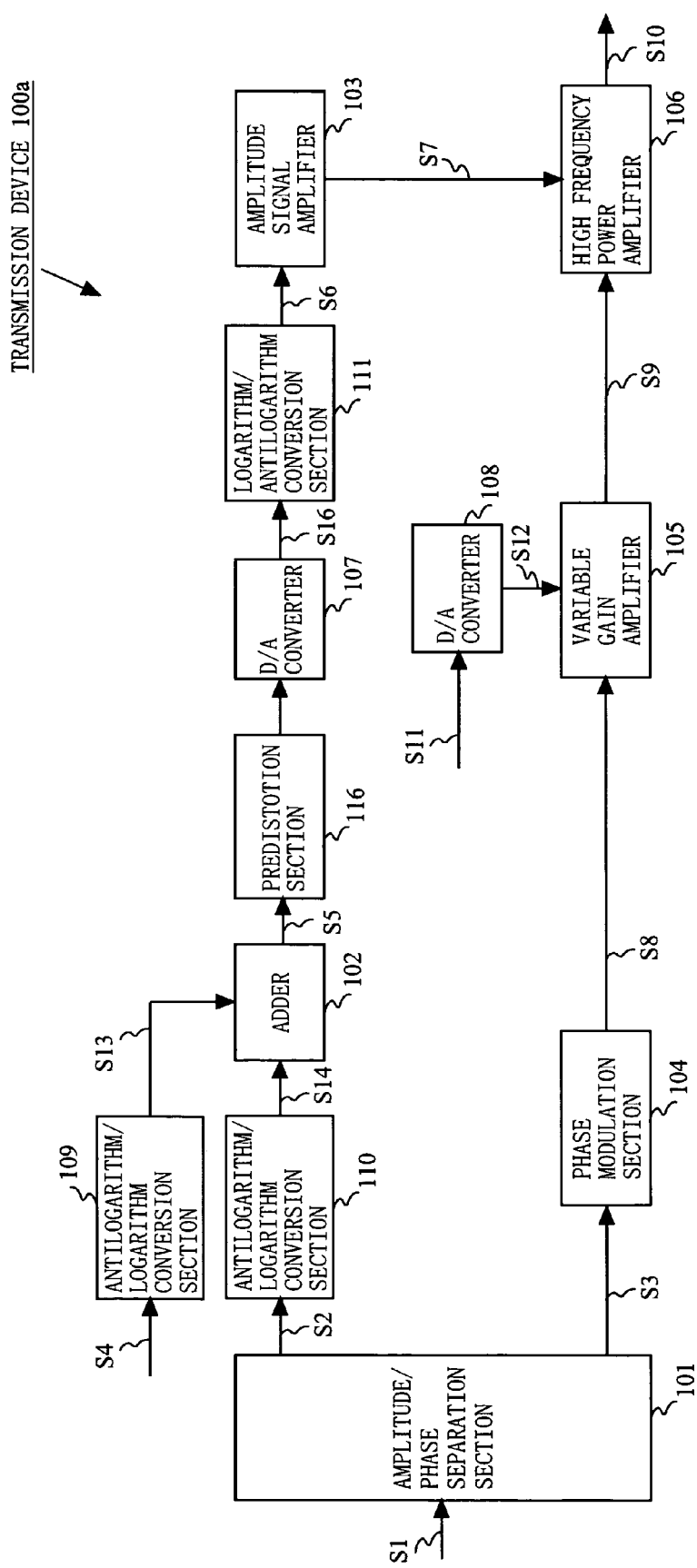
FIG. 9A is a block diagram showing an exemplary structure of a transmission apparatus 100a including a predistortion section 116.

The above-described transmission apparatuses 100 and 200 may each further include a predistortion section 116 for suppressing a distortion of an output signal. The predistortion section 116 is connected at any location on a stage before a block for generating a distortion (typically, the high frequency power amplifier 106). The predistortion section 116 predistorts the amplitude signal S7 supplied as a supply voltage to the high frequency power amplifier 106 such that at least the distortion generated in the high frequency power amplifier 106 is compensated for. FIG. 9A is a block diagram showing an exemplary structure of a transmission apparatus 100a including the predistortion section 116. Referring to FIG. 9A, the predistortion section 116 provides the transmission power-controlled amplitude signal S5 with a distortion having an opposite characteristic to that of the distortion generated in the high frequency power amplifier 106, in order to compensate for at least the distortion generated in the high frequency power amplifier 106. Typically, the predistortion section 116 is realized by a ROM table or a digital circuit. In the present invention, amplitude signals are represented on a log scale. Therefore, even an amplitude signal of a very low level has a small quantization error, and thus distortion compensation can be performed more accurately.

Third Embodiment

Figure 9B:
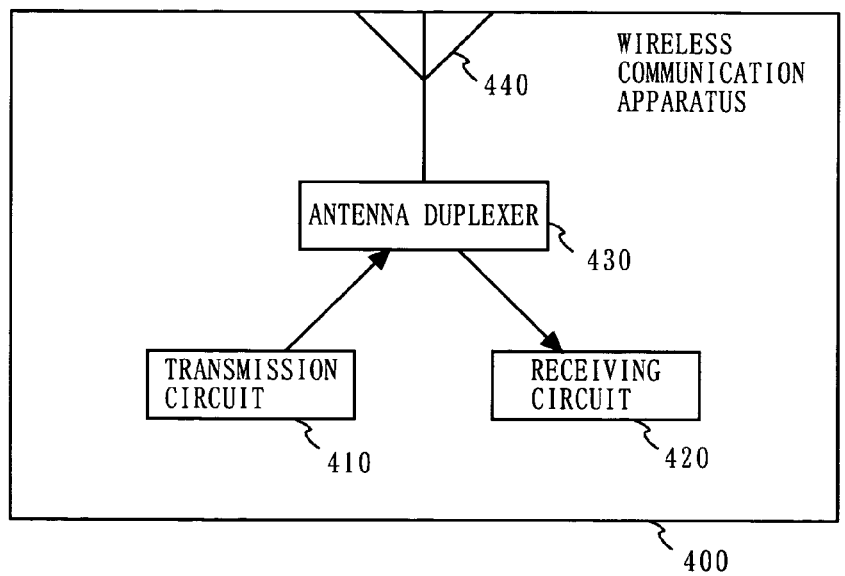
FIG. 9B is a block diagram showing an exemplary structure of a wireless communication apparatus according to a third embodiment of the present invention.
Figure 10:
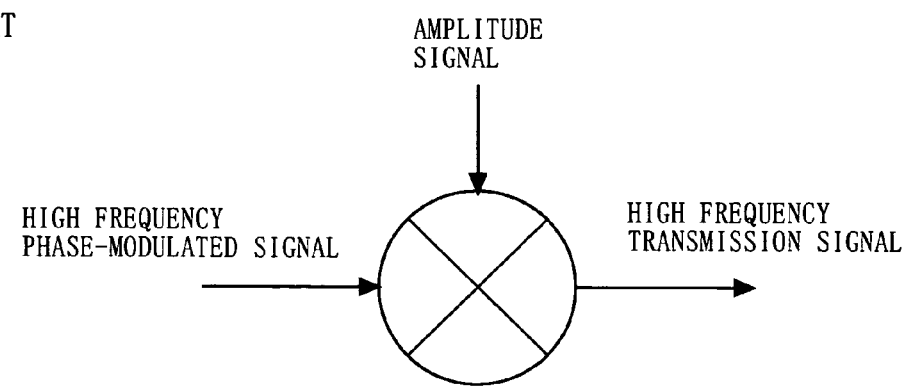
FIG. 10 provides a general illustration of a polar modulation system.
Figure 11:
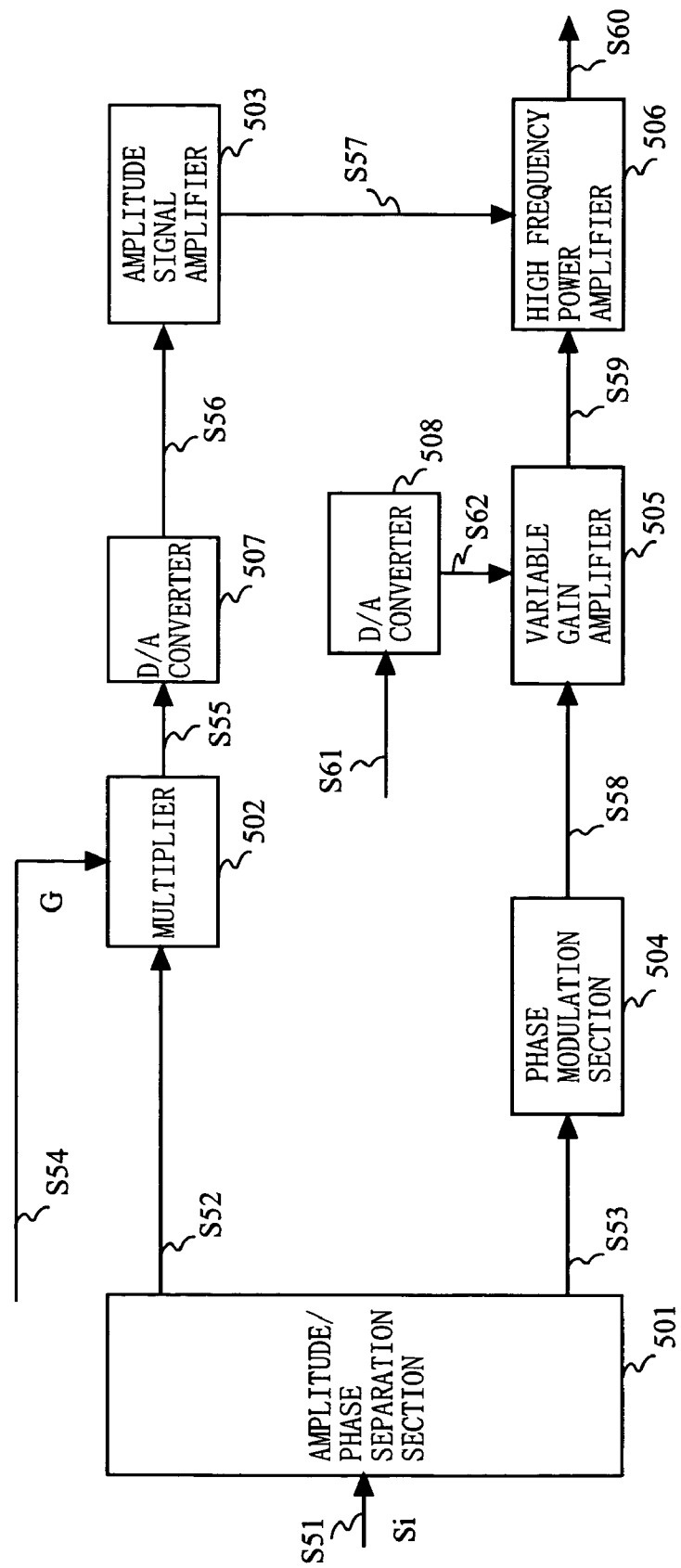
FIG. 11 shows an example of functional blocks of a conventional transmission apparatus 500.
Figure 12:
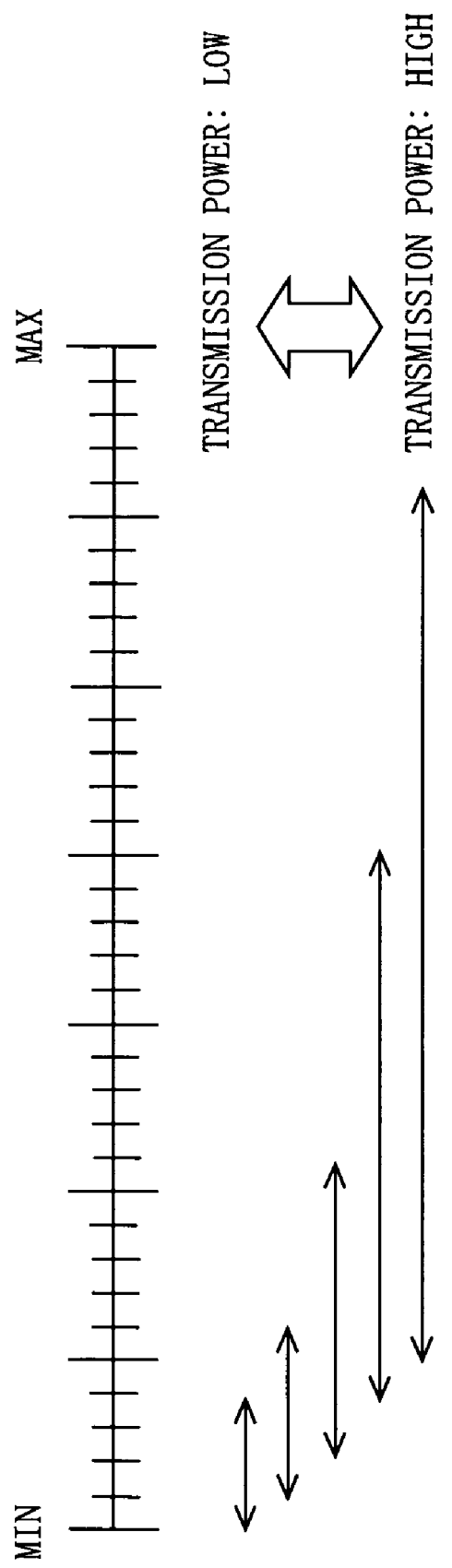
FIG. 12 shows different varying ranges of an amplitude signal S55 in accordance with the magnitude of transmission power.
Figure 13:
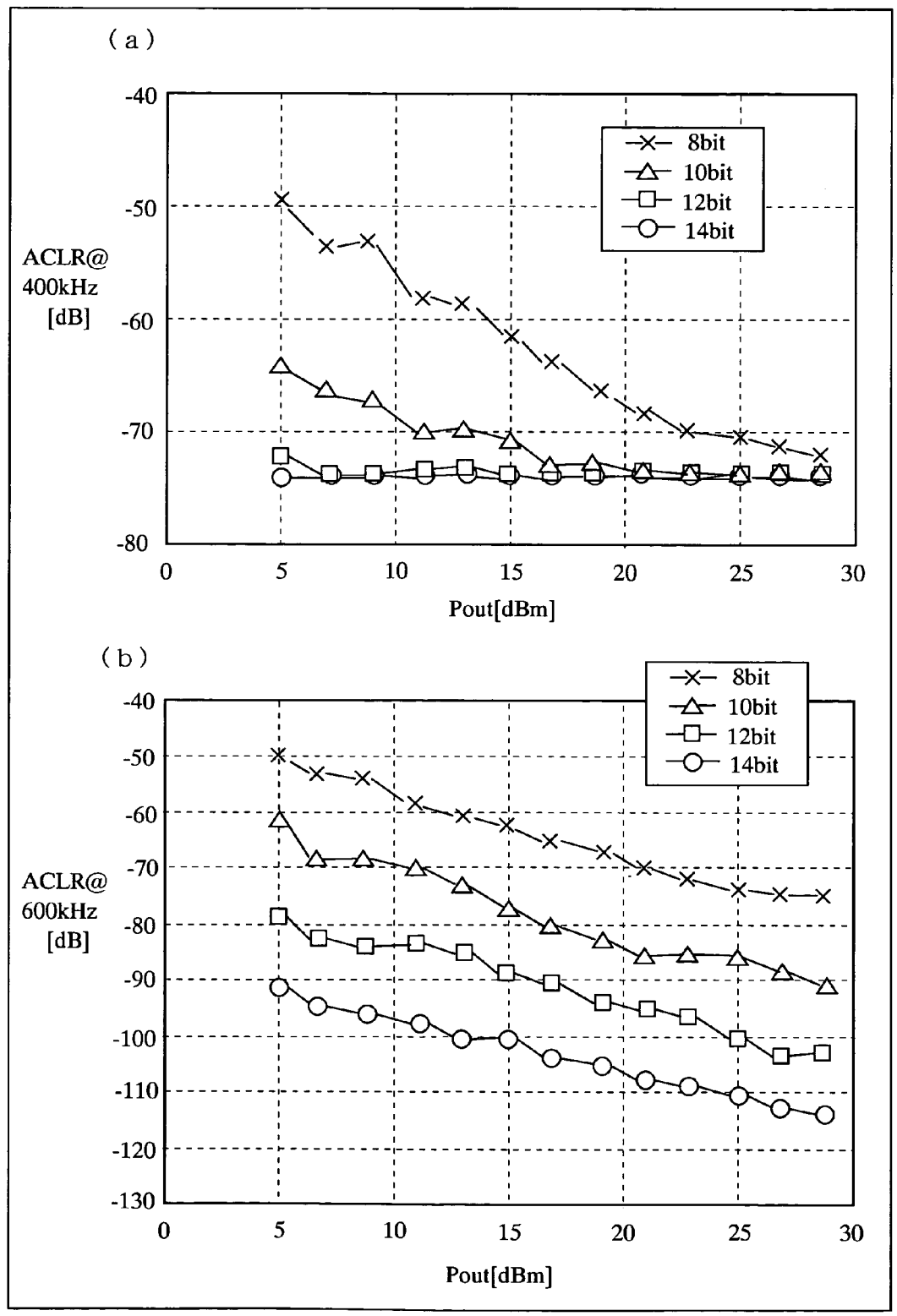
FIG. 13 shows a result of simulation indicating the influence of the quantization noise on the ACLR with the conventional transmission apparatus 500.
Figure 14:
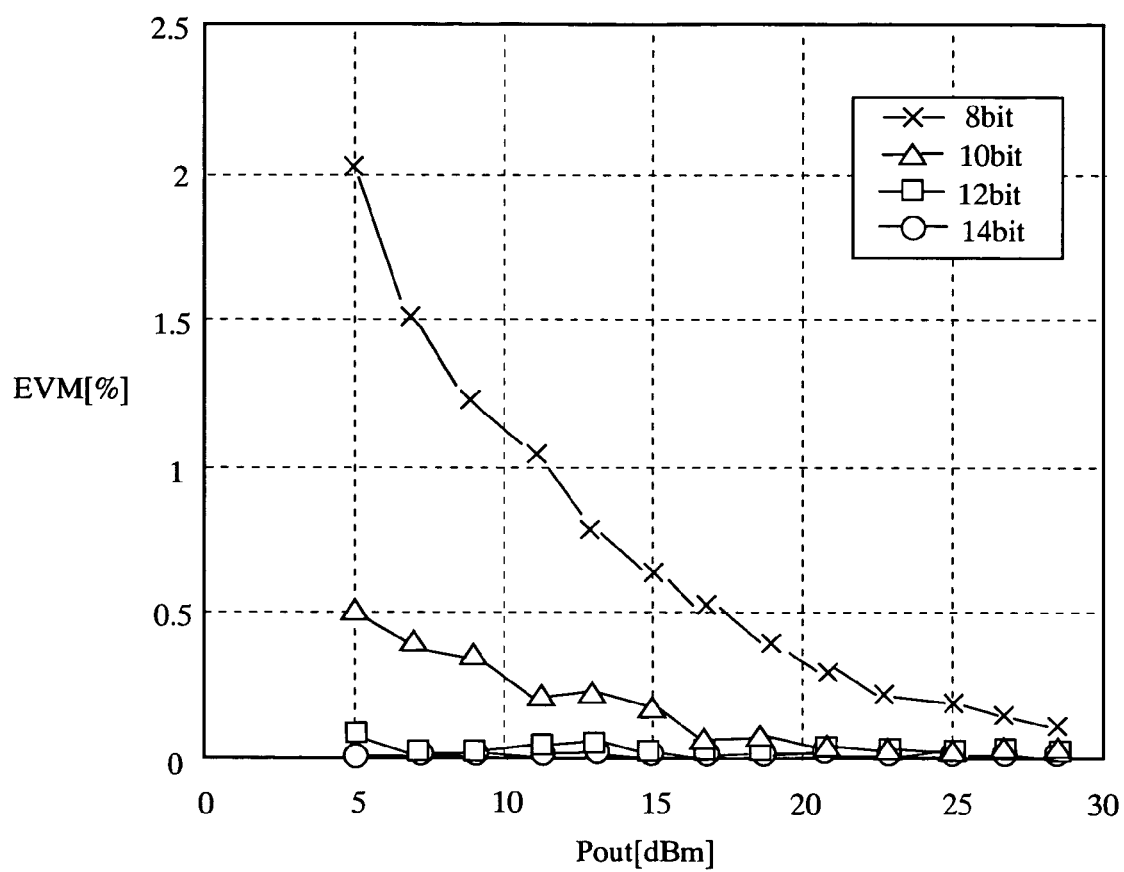
FIG. 14 shows a result of simulation indicating the influence of the quantization noise on the EVM with the conventional transmission apparatus 500.

FIG. 9B is a block diagram showing an exemplary structure of a wireless communication apparatus according to a third embodiment of the present invention. As shown in FIG. 9B, the wireless communication apparatus 400 according to the third embodiment includes a transmission circuit 410, a receiving circuit 430, an antenna duplexer 430, and an antenna 440. The transmission circuit 410 is a transmission apparatus described in the first or second embodiment. The antenna duplexer 430 transfers a transmission signal which is output from the transmission circuit 410 to the antenna 440 while preventing the transmission signal from leaking to the receiving circuit 420. The antenna duplexer 430 also transfers a receiving signal which is input from the antenna 440 to the receiving circuit 420 while preventing the receiving signal from leaking to the transmission circuit 410. Accordingly, the transmission signal is output from the transmission circuit 410 and released to the outside from the antenna 440 via the antenna duplexer 430. The receiving signal is received by the antenna 440 and received by the receiving circuit 420 via the antenna duplexer 430.

The communication device 400 according to the third embodiment uses a transmission apparatus according to the first or second embodiment and thus can prevent the ACLR or the EVM from being deteriorated even when the transmission power is low and thus the amplitude signal is of a low level, while improving the power efficiency. Such a wireless communication device is capable of transmitting and receiving signals at high quality and realizes an improved power efficiency. In addition, since no branching element such as a directional coupler or the like is provided outside the transmission circuit 410, the loss from the transmission circuit 410 to the antenna 440 can be reduced. Therefore, the power consumption at the time of transmission can be reduced, which allows the wireless communication apparatus 400 to be used for a long period of time. The wireless communication apparatus 400 may include only the transmission circuit 410 and the antenna 440.

A transmission apparatus according to the present invention is applicable to, for example, a wireless communication apparatus such as a cellular phone or wireless LAN device.

While the invention has been described in detail, the foregoing description is in all aspects illustrative and not restrictive. It is understood that numerous other modifications and variations can be devised without departing from the scope of the invention.

What is claimed is:

1. A polar modulation transmission apparatus, comprising:
   an amplitude/phase separation section for separating a baseband signal to be modulated into an amplitude signal and a phase signal;
   a first antilogarithm/logarithm conversion section for performing antilogarithm/logarithm conversion on the amplitude signal and outputting the resultant signal as a logarithm-represented amplitude signal;
   a second antilogarithm/logarithm conversion section for performing antilogarithm/logarithm conversion on a transmission power control signal and outputting the resultant signal as a logarithm-represented transmission power control signal;
   an adder for adding the logarithm-represented transmission power control signal to the logarithm-represented amplitude signal, and outputting the resultant signal as a transmission power-controlled amplitude signal;
   a logarithm/antilogarithm conversion section for performing logarithm/antilogarithm conversion on the transmission power-controlled amplitude signal and outputting the resultant signal as an antilogarithm-represented amplitude signal;
   a phase modulation section for performing phase modulation on a high frequency carrier wave signal based on the phase signal and outputting the resultant signal as a high frequency phase-modulated signal;
   a high frequency power amplifier for performing amplitude modulation on the high frequency phase-modulated signal based on a supply voltage supplied thereto, and outputting the resultant signal as a high frequency transmission signal; and
   an amplitude signal amplifier for amplifying the antilogarithm-represented amplitude signal and supplying the resultant signal as the supply voltage to the high frequency power amplifier.

2. A polar modulation transmission apparatus according to claim 1, wherein the high frequency power amplifier operates as a nonlinear amplifier and performs amplitude modulation on the high frequency phase-modulated signal in accordance with the transmission power control signal and the amplitude signal.

3. A polar modulation transmission apparatus according to claim 1, further comprising a variable gain amplifier for amplifying the high frequency phase-modulated signal with a controlled gain on a stage after the phase modulation section.

4. A polar modulation transmission apparatus according to claim 3, wherein:
   the amplitude signal amplifier selectively supplies the high frequency power amplifier with a supply voltage in accordance with the amplitude signal and the transmission power control signal or a predetermined fixed value supply voltage;
   when the supply voltage in accordance with the amplitude signal and the transmission power control signal is selected, the high frequency power amplifier operates as a nonlinear amplifier, and performs amplitude modulation on the high frequency phase-modulated signal amplified by the variable gain amplifier in accordance with the transmission power control signal and the amplitude signal and outputs the resultant signal as the high frequency transmission signal; and
   when the predetermined fixed value supply voltage is selected,
      the variable gain amplifier performs amplitude modulation on the high frequency phase-modulated signal which is output from the phase modulation section in accordance with the transmission power control signal and the amplitude signal, and
      the high frequency power amplifier operates as a linear amplifier, and amplifies the signal processed by the amplitude modulation by the variable gain amplifier and outputs the resultant signal as the high frequency transmission signal.

5. A polar modulation transmission apparatus according to claim 4, further comprising a third adder for adjusting transmission power between the adder and the variable gain amplifier, wherein the third adder adds a gain adjusting value to the transmission power-controlled amplitude signal.

6. A polar modulation transmission apparatus according to claim 1, wherein the amplitude signal amplifier includes a switching regulator or a class D amplifier.

7. A polar modulation transmission apparatus according to claim 1, further comprising a second adder for adjusting transmission power between the adder and the logarithm/antilogarithm conversion section, wherein the second adder adds a gain controlling value to the transmission power controlled amplitude signal.

8. A polar modulation transmission apparatus according to claim 1, further comprising a D/A conversion section at any position on a stage before the logarithm/antilogarithm conversion section, wherein an analog signal converted by the D/A conversion section is input to the logarithm/antilogarithm conversion section.

9. A polar modulation transmission apparatus according to claim 1, further comprising a predistortion section, connected at any location at a stage before the high frequency power amplifier, for predistorting the amplitude signal supplied as a supply voltage to the high frequency power amplifier, such that at least a distortion generated in the high frequency power amplifier is suppressed.

10. A wireless communication section, comprising:
- a transmission circuit for generating a transmission signal; and
- an antenna for outputting the transmission signal generated by the transmission circuit;
- wherein the transmission circuit is a polar modulation transmission apparatus according to claim 1.

11. A wireless communication apparatus according to claim 10, further comprising:
- a receiving circuit for processing a receiving signal received from the antenna; and
- an antenna duplexer section for outputting the transmission signal generated by the transmission circuit to the antenna, and outputting the receiving signal received from the antenna to the receiving circuit.

* * * * *